United States Patent [19]
Krenik et al.

[11] Patent Number: 5,281,860
[45] Date of Patent: Jan. 25, 1994

[54] METHOD AND APPARATUS FOR AN IMPROVED MULTIPLE CHANNEL SENSOR INTERFACE CIRCUIT

[75] Inventors: William R. Krenik, Garland, Tex.; Norman L. Culp, Monument, Colo.; Chih-Hung Lin, Xin Dian City, Taiwan

[73] Assignee: Texas Instruments Incorporated, Dallas, Tex.

[21] Appl. No.: 994,433

[22] Filed: Dec. 21, 1992

Related U.S. Application Data

[63] Continuation of Ser. No. 736,356, Jul. 26, 1991, abandoned.

[51] Int. Cl.⁵ .................... H03K 17/76; H03K 5/00
[52] U.S. Cl. .................... 307/243; 307/244; 307/353; 328/104; 328/105; 328/127; 328/137; 328/151; 328/153; 328/154
[58] Field of Search ............ 307/243, 244, 352, 355, 330/69, 109, 147; 328/104, 127, 128, 137, 153, 154, 105, 151; 333/173

[56] References Cited

U.S. PATENT DOCUMENTS

| | | | |
|---|---|---|---|
| 4,315,227 | 2/1982 | Fleischer et al. | 333/173 |
| 4,352,069 | 9/1982 | Dessoulavy | 328/128 |
| 4,438,354 | 3/1984 | Hague | 307/493 |
| 4,443,757 | 4/1984 | Bui | 333/173 |
| 4,446,438 | 5/1984 | Chang et al. | 328/127 |
| 4,453,130 | 6/1984 | Bennet | 328/127 |
| 4,520,283 | 5/1985 | Sasaki et al. | 333/173 |
| 4,714,843 | 12/1987 | Smith | 328/127 |
| 4,746,871 | 5/1988 | de la Plaza | 307/494 |
| 4,760,346 | 7/1988 | Kultgen et al. | 307/243 |
| 4,769,129 | 9/1988 | Tamakoshi et al. | 333/173 |
| 4,835,482 | 5/1989 | Tamakoshi et al. | 333/173 |
| 4,845,383 | 7/1989 | Iida | 307/355 |
| 5,039,963 | 8/1991 | Fischer | 333/173 |
| 5,081,372 | 1/1992 | Pelgrom | 328/151 |

OTHER PUBLICATIONS

Brodersen et al; "MOS Switched-Capacitor Filters", 1979.

Primary Examiner—William L. Sikes
Assistant Examiner—Terry D. Cunningham
Attorney, Agent, or Firm—Richard L. Donaldson; Mark E. Courtney

[57] ABSTRACT

A method and apparatus for an improved multiple channel sensor interface circuit is described which comprises a plurality of input integrator circuits (35) coupled in parallel; a switched capacitor multiplexer (37) coupled to the input integrator circuits (35); and an output integrator stage (39) coupled to the switched capacitor multiplexer (37). An additional embodiment is described wherein a multiple channel voltage sensor interface circuit comprising a plurality of switched capacitor storage elements (S26 . . . S28) is coupled to a plurality of inputs; a plurality of integrator amplifiers (51, 53) is coupled to the switched capacitor storage elements (C22 . . . C30); and timing circuitry is coupled to the switched capacitor storage elements (C221 . . . C30) and to integrator amplifiers (51, 53) operable to selectively enable sampling of the inputs.

17 Claims, 8 Drawing Sheets

METHOD AND APPARATUS FOR AN IMPROVED MULTIPLE CHANNEL SENSOR INTERFACE CIRCUIT

This application is a continuation of application Ser. No. 07/736,356, filed Jul. 26, 1991, now abandoned.

FIELD OF THE INVENTION

This invention generally relates to sensor systems having multiple channels, wherein it is desired or necessary that each channel provide a uniform output for the same input. Since the channels are physically separated, the difficulties of matching the channels such that each channel has the same physical characteristics may become prohibitive. Further, when building a multiple channel sensor system on an integrated circuit, the necessity of matching channels which are physically separated may make fabrication impracticable as the process variations across an integrated circuit may become so great as to prevent proper operation of the device. The circuit technique introduced herein avoids this problem, making large well-matched sensor arrays possible.

BACKGROUND OF THE INVENTION

Without limiting the scope of the invention, its background is described in connection with a multiple channel video sensor having multiple analog video inputs which are sampled in parallel and having a single time multiplexed analog output channel, the output reflecting the value of a single one of the input channels at any particular time, such as might be found in a facsimile machine, as an example.

Heretofore, in this field, the standard method of implementing such a sensor interface was to build a bank of integrator circuits followed by a bank of sample-hold amplifiers, followed by a multiplexer which determines which channel's signal is to be transmitted to the sensor interface output. This approach requires two amplifiers per channel, and it also imposes a requirement that each channel be identically matched to all the others. Further, any normal offset voltages which occur in the sample-hold circuits are transmitted to the output and result in further channel to channel non uniformity.

Accordingly, it is a goal of this invention to create improvements which overcome the requirement of channel matching, the sensitivity to offset voltages in the sample-hold circuits, and which is more efficient to design, test and manufacture.

SUMMARY OF THE INVENTION

Generally, and in one form of the invention, an improved multiple channel sensor interface circuit is described which comprises a plurality of input integrator circuits coupled in parallel; a switched capacitor multiplexer coupled to the input integrator circuits; and an output integrator stage coupled to the switched capacitor multiplexer.

An additional embodiment is described which is a multiple channel voltage sensor interface circuit, comprising a plurality of switched capacitor storage elements coupled to a plurality of inputs; a plurality of integrator amplifiers coupled to the switched capacitor storage elements; and timing circuitry coupled to the switched capacitor storage elements and to the integrator amplifiers operable to selectively enable sampling of the inputs.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

Figure 1:
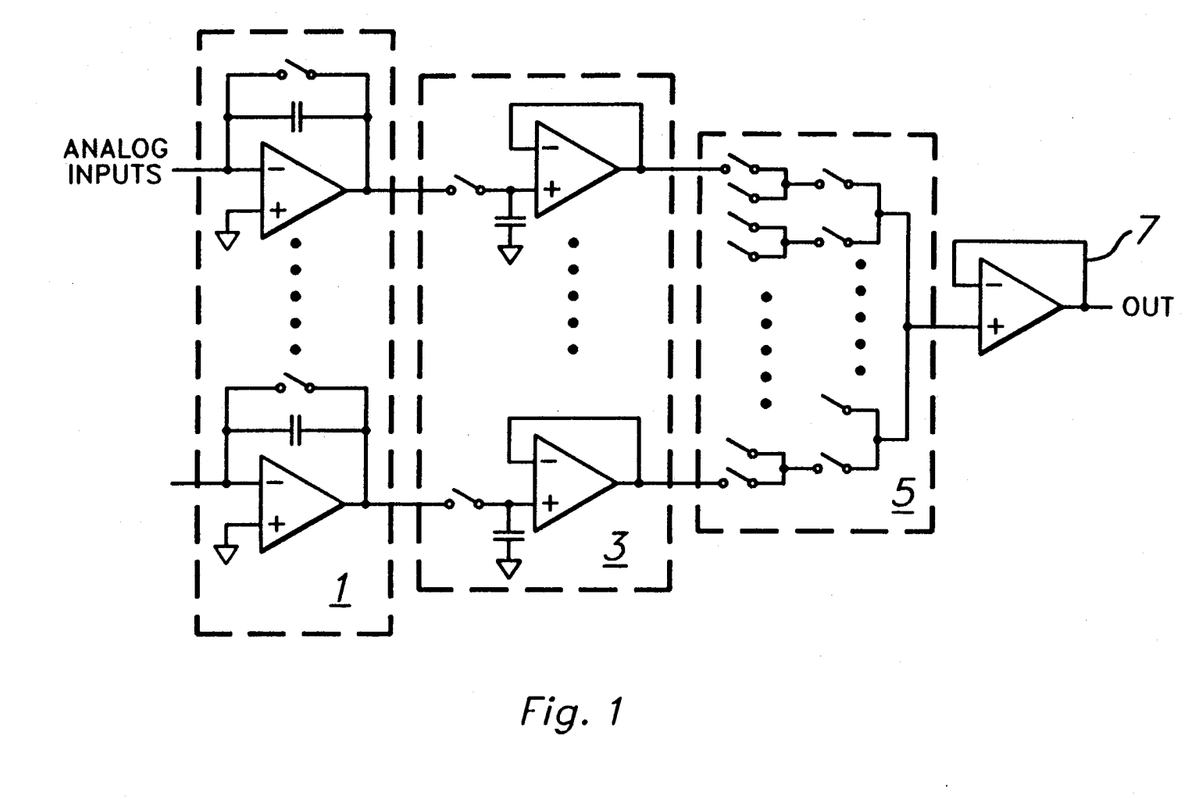
FIG. 1 is a block diagram of a prior art multiple channel sensor system.

In FIG. 1, a prior art multiple channel sensor interface is detailed. Integrator circuits 1 are connected to sample the analog current or charge inputs. Sample-hold circuits 3 then sample the output of the individual integrators. Analog multiplexer 5 is used to sequentially transmit the sampled value of each individual channel to output buffer 7.

Figure 2:
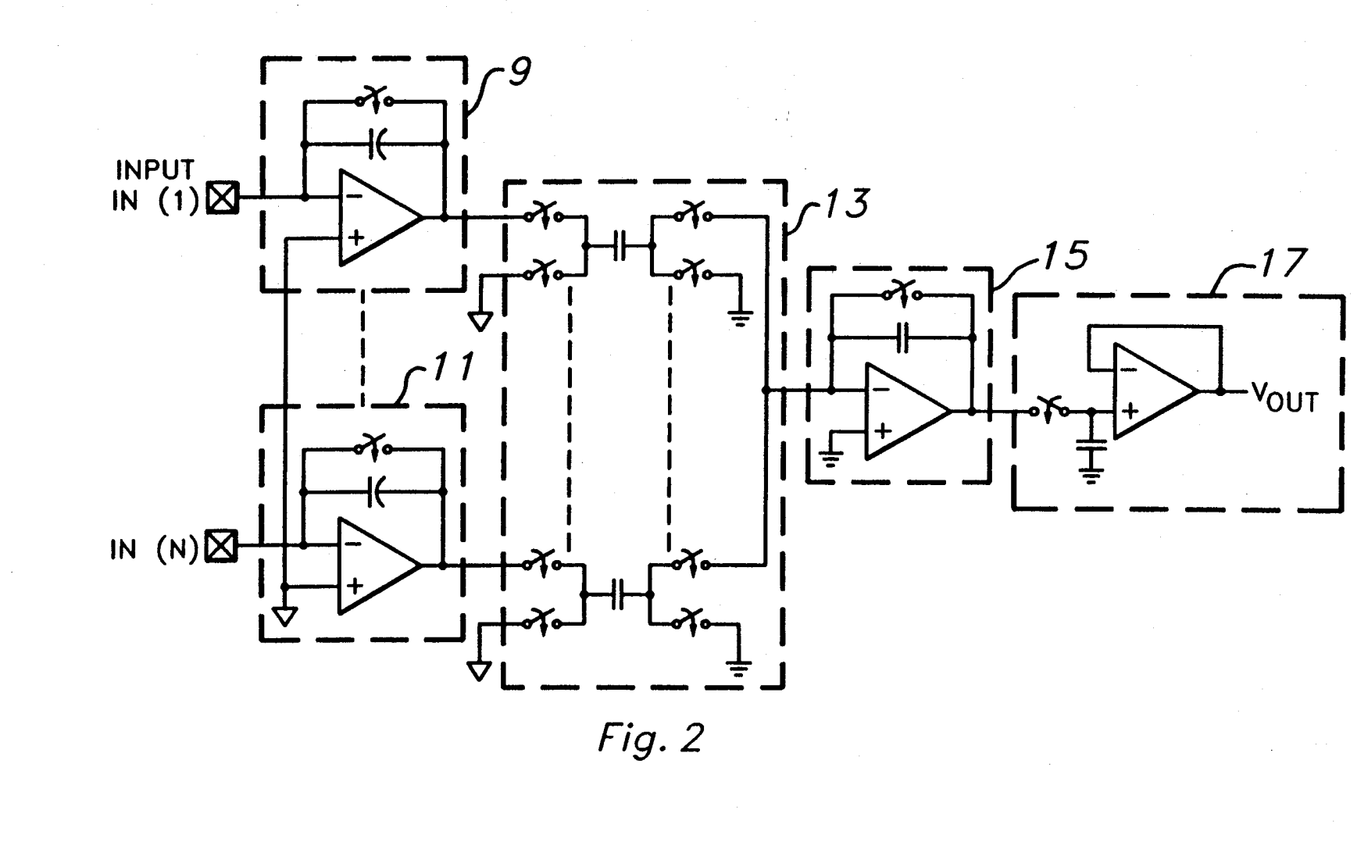
FIG. 2 is a block diagram of an improved multiple channel current or charge sensor circuit embodying the invention.

In FIG. 2, the improved multiple channel sensor interface of the invention is shown. This embodiment is suited to applications wherein the interface is to sense charge or current as inputs. Input integrator amplifiers 9 are coupled to each of the analog inputs. Switched capacitor multiplexer 13 captures the outputs of the integrator amplifiers. Integrator 15 is used to sequentially transfer the sampled charge stored by each channel. Sample-hold circuit 17 then provides a constant voltage output.

Figure 2A:
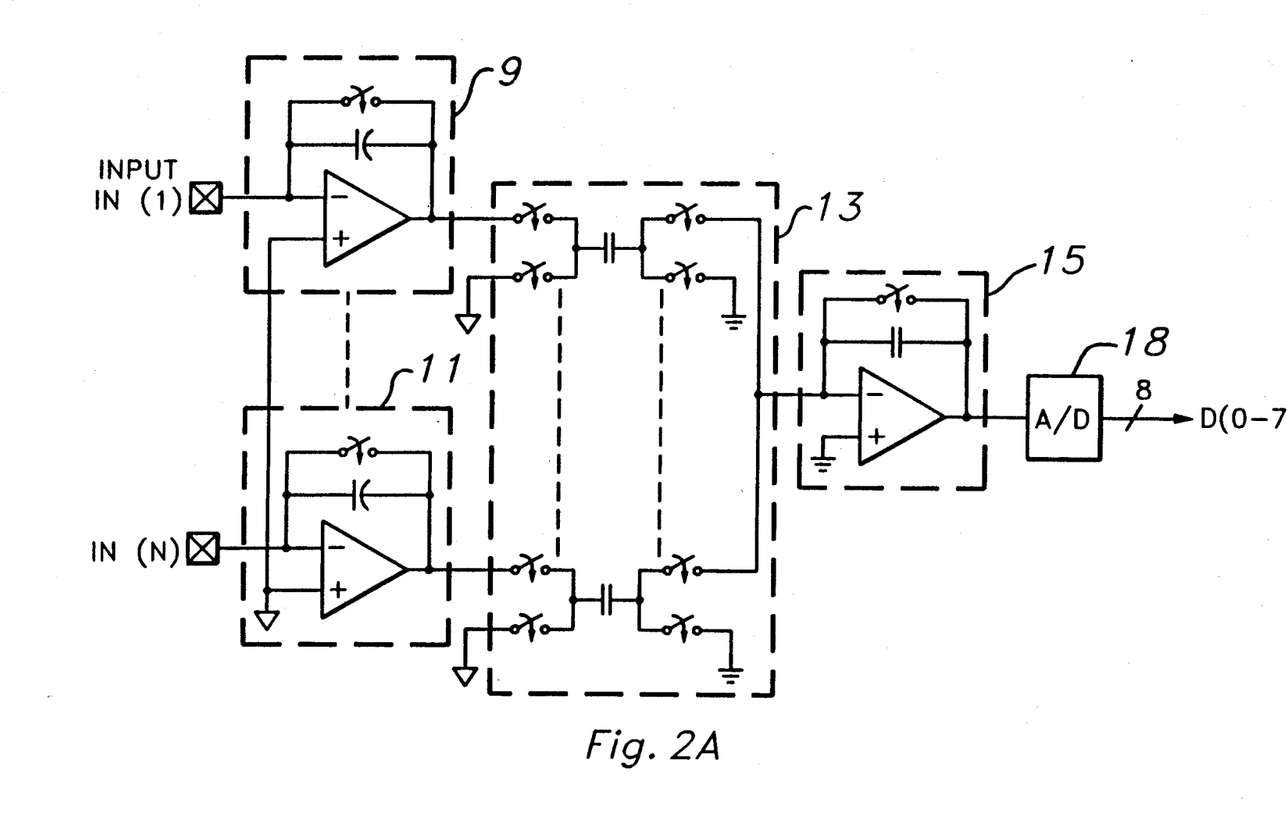
FIG. 2A is an alternative embodiment of the invention depicted in FIG. 2.

FIG. 2A depicts an alternative embodiment wherein the sample hold circuit 17 of FIG. 2 is replaced with the analog to digital converter 18 shown in FIG. 2A, for use in applications where a digital representation of the output is required.

Figure 3:
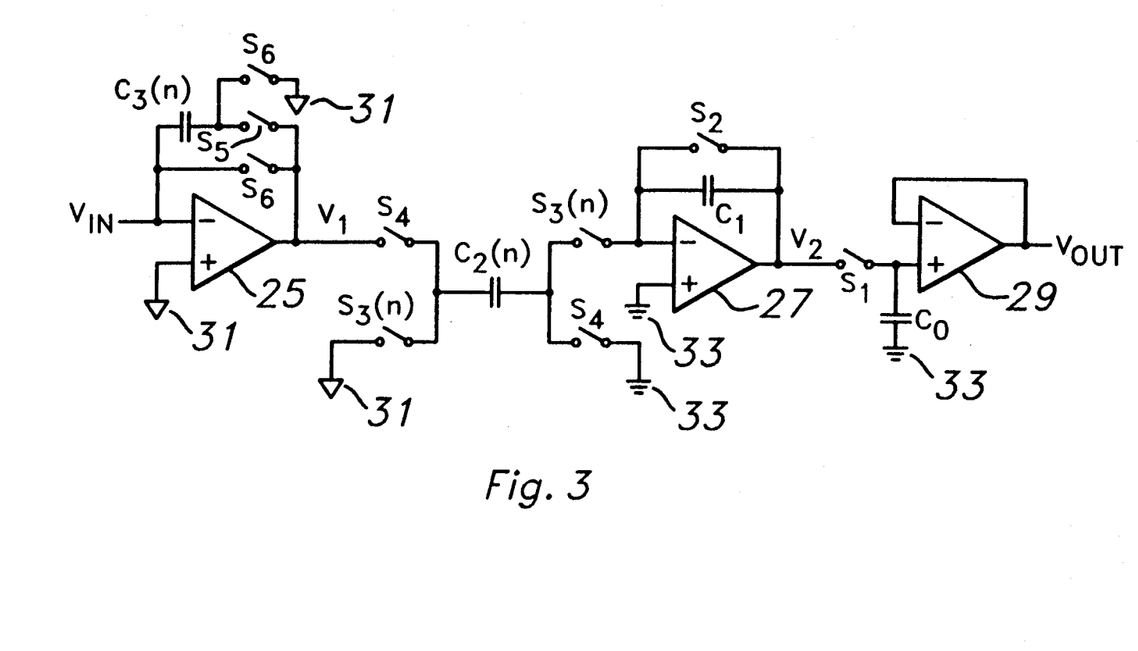
FIG. 3 is a schematic diagram of a typical single channel circuit in the device of FIG. 2.

In FIG. 3, a single channel n of the multiple channel sensor interface of the invention is shown. Amplifier 25 is coupled with capacitor $C_3(n)$ and switch S5 to form the integrator input stage. Switches S4 and S3(n) are coupled with capacitor $C_2(n)$ to form the switched capacitor multiplexer stage. Amplifier 27 is coupled with capacitor $C_1$ and switch S2 to form the sampling integrator stage. Switch S1 is coupled with capacitor $C_0$ and amplifier 29 to form the sample-hold output stage. The switches may be fabricated using any one of several alternatives known in the art, typically through the use of CMOS or bipolar transistors. Timing circuitry to open and close the switches at appropriate times is fabricated using any well known design technique, such as digital logic comprising a state machine with a PLA to decode the switch control signals.

In operation, switch S5 is closed in all channels to allow the inputs to be integrated onto capacitor $C_3(n)$ in each channel simultaneously. After the integration period, switches S4 are closed to enable the capacitive multiplexer element in each channel to sample the integrator outputs in parallel, and then store the sampled charge onto the capacitors $C_2(n)$ in each channel. At the end of the input integrator sampling phase, switches S4 are opened to stop the input sampling. Switches $S3_{(n)}$ are then closed sequentially in each channel to enable output integrator capacitor $C_1$ to receive the sensed data from the currently selected channel. Switch S2 is closed between each transfer to ready the output integrator stage for receiving the sensor data from the next channel. Finally, switch S1 is closed while switch S2 is opened and the current channel switch S3(n) is closed to enable the sensor data to be captured at the output of the sample-hold output stage. The output of the sample-hold buffer will be a continuous voltage output.

To demonstrate the absence of a channel matching requirement in the improved multiple channel sensor interface circuit of the invention, the reader is referred to the example channel depicted in FIG. 3. The voltage $V_1$ produced at the output of the input integrator stage is given by:

$$V_{1(n)} = \frac{Q_{input(n)}}{C_{3(n)}}$$

for a charge input, or $$V_1 = \frac{(I_{input(n)})T}{C_{3(n)}}$$

where T is the integration time for a current input.

When the channels are sequentially scanned to produce the output voltage at the output of the output integrator, the charge transferred from capacitor $C_{2(n)}$ to capacitor $C_1$ is:

$$Q_{C1} = C_{2(n)}V_1$$

where $V_1$ is available above. Thus, by substitution $$Q_{(C1)} = Q_{input(n)} \frac{C_{2(n)}}{C_{3(n)}}$$

for a charge input, or $$Q_{C1} = (I_{input(n)}T) \frac{C_{2(n)}}{C_{3(n)}}$$

for a current input. Since the voltage $V_2$ produced at switch S1 is simply $$V_2 = \frac{Q_{C1}}{C_1} = \left( Q_{input(n)} \frac{C_{2(n)}}{C_{3(n)}} \right) \frac{1}{C_1}$$

for each input channel, it becomes clear that the output produced by a given channel n is directly proportional to the current or charge input and on the ratio of $C_2$ to $C_3$, and that the output has no relationship to the absolute physical characteristics of a particular channel. To produce highly uniform sensor interfaces all that is required is that the ratio of the two capacitors $C_2$ and $C_3$ be kept constant between channels. Since these two capacitors are placed in close physical proximity, the control of this ratio is easy to achieve. This is a large advantage over the circuits of the prior art, wherein capacitance matching was required between channels which could be several hundred mils apart.

The above discussion assumes the input integrator stage 25 exhibits no offset voltage. In practice, the input integrator stage 25 will add an offset voltage to the voltage output into the switched capacitor multiplexer stage. This offset will vary from channel to channel, and to assure uniform output for a uniform input the offset voltage must be canceled through offset cancellation or auto-zeroing techniques. By using switches S5 and S6, the offset cancellation is accomplished. Between sampling periods the capacitor $C_3(n)$ has placed on it a voltage of $-V_{os}$ by the closing of switches S6. When the integrator is in input mode, switch S5 is closed and the capacitor $C_3(n)$ receives the voltage Vi plus the offset voltage of amplifier 25. Thus, the output of the input integrator stage at $V_1$ is given by:

$$V_1 = \frac{Q_{input(n)}}{C_{3(n)}} + V_{os} - V_{os}$$

which shows that the use of switches S6 eliminates the offset in each channel and maintains the channel-channel uniformity required.

The use of different ground voltages 31 and 33 in FIG. 3 allows the use of the switched capacitor multiplexer circuit to level-shift the input integrator sample to a different bias level at the output. Of course, this is entirely optional and for applications where the bias level requirements are the same at the input and the output, these two ground voltages may be the same or tied together.

Care must be taken in the implementation to prevent loss of the stored charge on capacitor $C_{3(n)}$ in the first cycle. To understand this, consider that reference voltage 31 is at a potential of 1 volt, reference voltage 33 is at zero volts, and capacitor $C_3$ is charged to 3 volts. When switch S4 is closed to being sampling the integrated value onto capacitor $C_2$, the voltage at node $V_1$ will instantaneously go to 0 volts, as the capacitor has to be charged to the voltage on $C_3$. This results in the switch S6 having a $-2$ volt potential drop across it. In an integrated circuit, switch S6 may be implemented, for example, with a NMOS transistor. If the voltage at the source or drain is less than that at the gate by more than the $V_t$ of the transistor, current will begin to flow away from node $V_1$ towards the input terminal and erroneously discharge $C_3$. This is prevented in the current embodiment by precharging capacitor $C_2$ before the first cycle begins, so that $C_2$ in each channel has a voltage of the voltage at reference 31 minus the voltage at reference 33 placed on it, which will be the voltage on it after each cycle. By insuring that the instantaneous voltage at node $V_1$ is such that the voltage across switch S6 is never greater than the $V_t$ of switch S6, this error is prevented for all cycles. This initialization step can easily be handled by the timing circuitry driving the switching sequences.

As shown in FIG. 3, there is only one sample-hold amplifier in the circuit of the invention, so that any offset voltage which occurs in the sample-hold circuit affects all of the channels equally thus providing further improvement over the prior art circuit in channel-channel uniformity.

Also as shown above, the voltage $V_2$ at the output of the output integrator 27 is inversely proportional to the value of the capacitor $C_1$. Since this same capacitor is used to sample each of the channels, and the output voltage of each sample will depend on $C_1$ in exactly the same way, capacitor $C_1$ can be adjusted to uniformly adjust the gain across all the channels. This adjustment could be made electronically, by changing the interconnect information on a mask level for an integrated circuit which includes the system, of possibly through the use of nonvolatile programming either at the time of manufacture or in the application itself, or through any other means.

Figure 4:
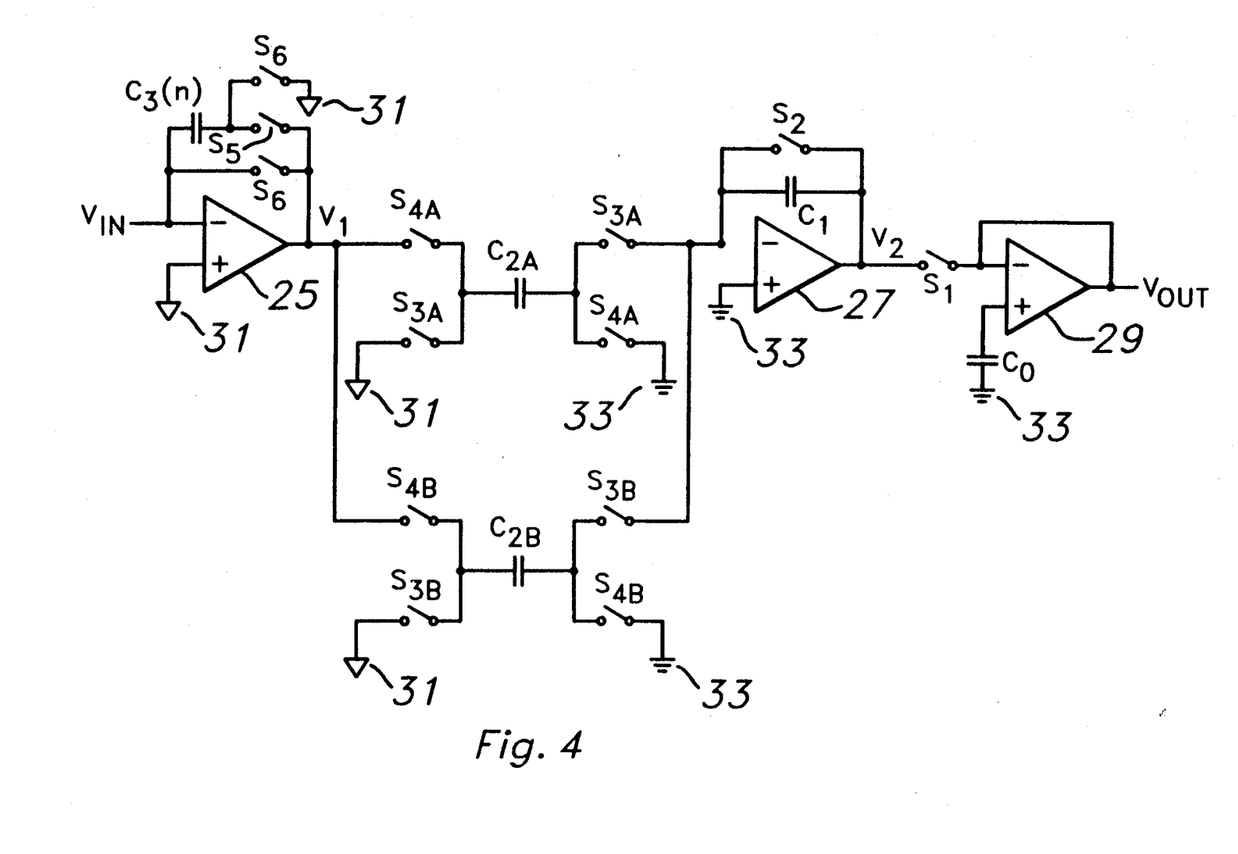
FIG. 4 is a schematic diagram of one of the last channels circuit in the device of FIG. 2.

FIG. 4 details one of the channels which is at the end of the array and therefore sampled at the end of the sampling sequence. The basic structure of FIG. 3 is implemented, however there are now two switched capacitor banks, the first comprised of switches S3A(n), S4A, and $C_{2A}$; and the second comprised of switches S2B(n), S2B, and $C_{2B}$.

In applications where the input data stream is continuous, it is necessary to add the additional capacitor circuitry to the channels which are sampled last in the sequence. The data being integrated onto integrator amplifier 25 is alternatively sampled onto capacitor $C_{2A(N)}$ and capacitor $C_{2B(n)}$. This enables the sequential sampling circuitry to transfer the sampled charge to the output integrator Stage formed by amplifier 27 and capacitor $C_1$ for one bank while the alternate bank receives the newer integrated sample data. Without this provision, the channels sampled last in sequence would lose data in those applications where the sample rate at the input exceeds the transfer rate at the output, or in continuous data stream applications. Switches S3A and S4A are alternated with S3B and S4B in these channels by the switch timing circuitry, which is not shown.

Figure 5:
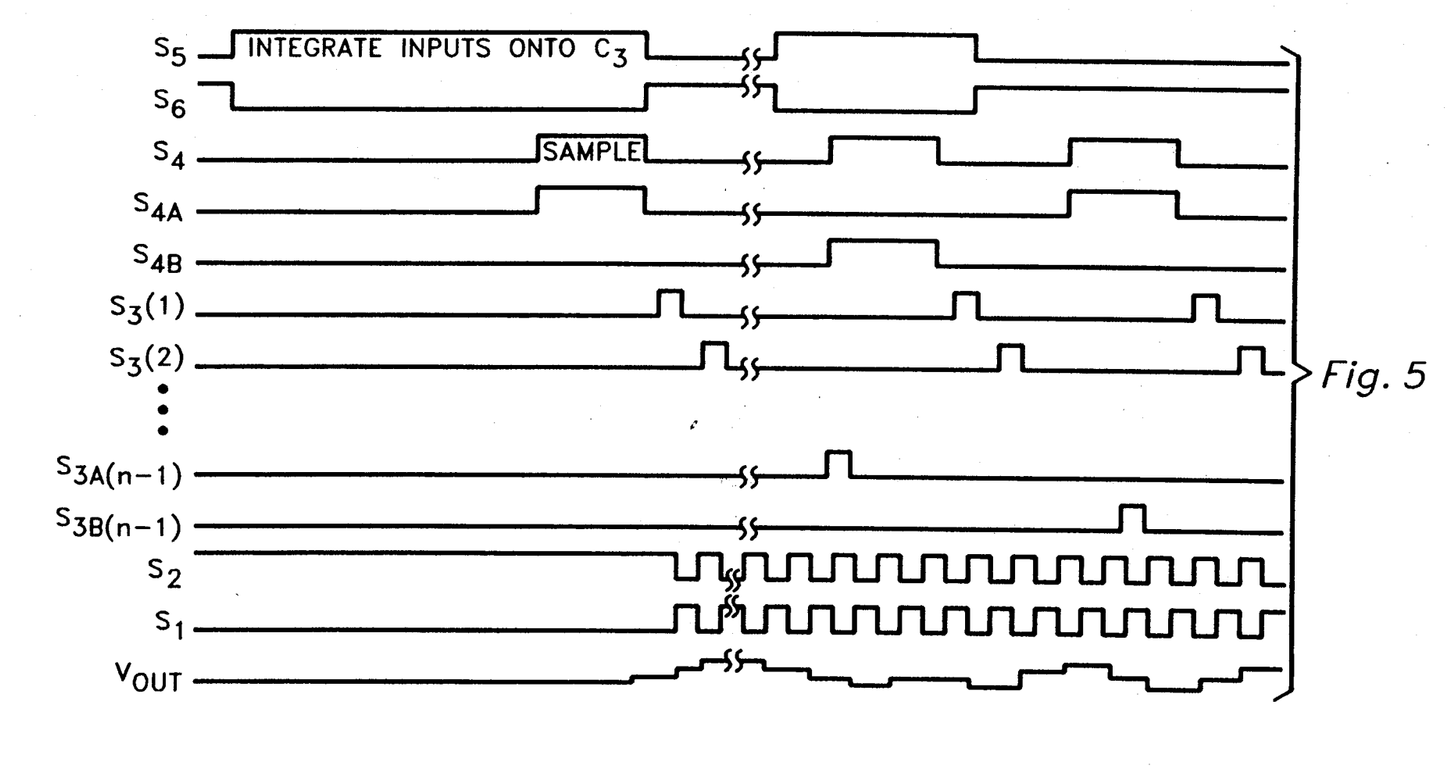
FIG. 5 is a waveform diagram of the switch timing of the single channel shown in FIG. 3.

FIG. 5 depicts the timing of the switches in the sample and output stages of operation of the embodiment shown in FIGS. 2 and 3. At the beginning of each cycle, switches S6 are closed and S5 are opened to enable the autozeroing feature to charge capacitor $C_3$ in each channel with the appropriate offset voltage. During the input integration stage, switches S5 are closed and S6 are open, to allow the input integrator circuit of each channel to be sampled onto the capacitor $C_3(n)$ in each channel in parallel. Switches S4 are then closed to sample the integrated data onto capacitors $C_{2(n)}$. For those channels which are high ordered channels, such as the one depicted in FIG. 4, switch S4A will be used alternately with S4b. This is indicated in FIG. 5 by the S4A and S4B signals. At the end of the input sampling phase, the switches S4 are opened. Switch S3(n) in each channel is operated sequentially to allow the selected channel to be sampled by the output integrator stage, and switch S2 is closed between channel sampling to ready the output integrator to receive the next channel's sensor input. Again, in high ordered channels switch S3A will be used alternately with S3B. Note that as shown in FIG. 5 for the channel (n−1), while switch S3A is operated to discharge capacitor C2A, switch S4B can be operated concurrently to capture the next data sample on capacitor C2B. Switch S1 is alternated with switch S2 to allow the output of the currently selected channel to be sampled by the output sample-hold stage. At the end of the sampling of the last channel, the input integration stage begins again with the closing of switches S5. The input integration phase, indicated in those time periods when S5 is closed, overlaps the sampling of the individual channels which occurs in those time periods when switches S3 are operated. Put another way, capacitors C2 may be discharged, transferring the current input sample to the output, while capacitors $C_3$ are charged, capturing the next set of input currents. This technique maximizes the data throughput rate of the circuit.

Figure 6:
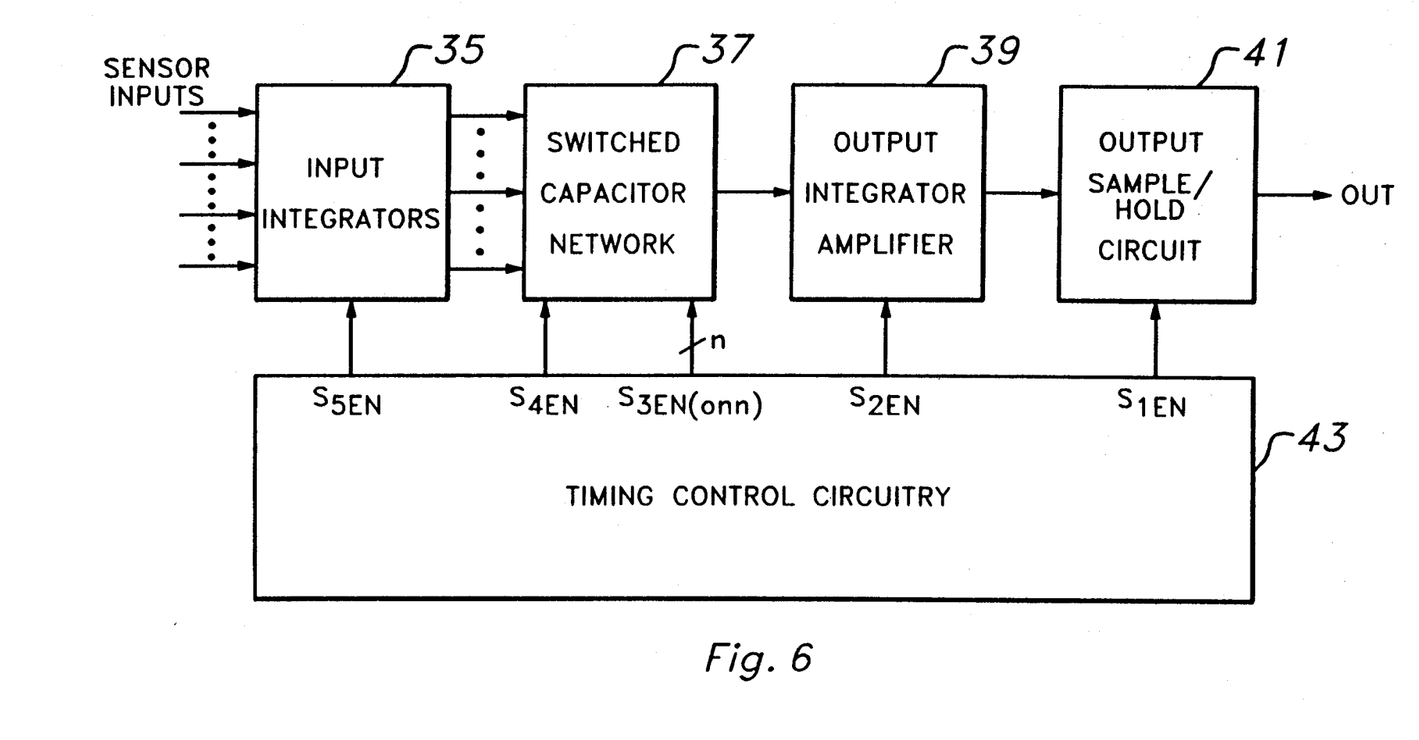
FIG. 6 is a block diagram of an integrated circuit implementing a multiple channel sensor interface using the improved multiple channel sensor circuit of FIG. 2.

FIG. 6 is a block diagram of an integrated circuit including the multiple channel sensor circuit of FIG. 3, and including the timing and control circuitry to produce the switching timing as shown in FIG. 5. Input integrators 35 are coupled to the sensor input pins, and feed into switched capacitor multiplexer 37. The output of multiplexer 37 is coupled to the output integrator circuit 39 and finally to the output sample-hold circuit 41. Timing circuit 43 provides switch controls to each of the switches in each of the above blocks. Details of timing circuit 43 are not shown, the timing circuitry can be implemented using straightforward sequential state machine design, logic trees, or programmable logic components using techniques well known to those experienced in the art.

In operation, this integrated circuit receives analog inputs, and concurrently samples the inputs onto all of the input integrator circuit capacitors $C_3$. These integrated values are then sampled onto the switched capacitor multiplexer capacitors $C_2$ for each channel. Then the sampling period is ended and the circuitry sequentially transmits the sensed value for each channel onto the output integrator amplifier capacitor $C_1$ and out through the sample-hold output buffer using capacitor $C_0$. The timing circuit provides the control lines to the switches to implement the sequence timing as shown in FIG. 3.

Figure 7:
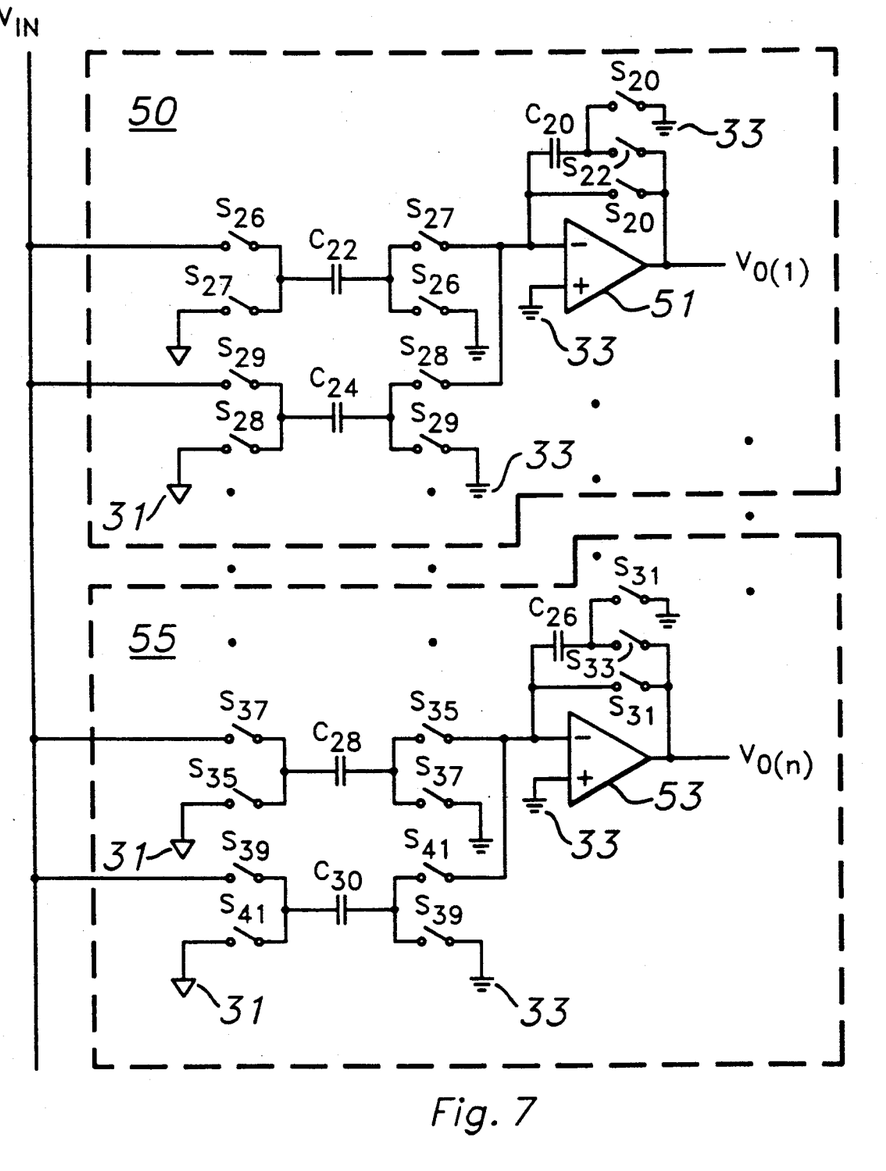
FIG. 7 is a schematic diagram of an alternative embodiment implementing an improved multiple channel voltage sensor circuit.

An alternative embodiment for applications where the input is a voltage level is shown in FIG. 7. Switches S26 and S27 and capacitor $C_{22}$ are coupled to create a first input to the first sensor channel. Switches S28, S29 and capacitor $C_{24}$ are coupled to create a second input to the first channel. Voltage V20 is the output of the selected one of the two inputs. Amplifier 51 is arranged with capacitor $C_{20}$ and switches S20 and S22 to create an integrator with offset voltage cancellation which takes as its input the voltage V20. Switch S24 allows the output of the first channel to be selectively output as V0. Second channel 55, comprised of switches S35, S37, S39, S41, S31 and S33 with capacitors $C_{28}$, $C_{30}$ and $C_{26}$ and amplifier 53 is identical to the first channel 50. The output will be a signal array representing the demultiplexed, sampled data.

In this embodiment, a time multiplexed input signal is fed into the switched capacitor multiplexer formed by switches S26, S27 and capacitor $C_{22}$, and the output of the switched capacitor multiplexer is then fed into integrators, for example the one formed by the amplifier 51 and the capacitor $C_{20}$. Switches S20 are used to place an offset cancellation voltage on capacitor $C_{20}$ when the capacitor is not being charged with sensed data.

The arrangement of two capacitors in parallel in a single input channel, for example capacitors $C_{22}$ and $C_{24}$ in FIG. 7, allows the sampling of time multiplexed input data. This single input channel may receive sensed data into capacitor $C_{24}$ while capacitor $C_{22}$ is being discharged into capacitor $C_{20}$. Additional multiplexing may be achieved by adding additional switched capacitor circuitry in parallel.

In operation, the charge stored onto capacitor $C_{22}$ is given by:

$$Q_{C_{22}} = C_{22} V_i.$$

The charge stored on capacitor $C_{22}$ is then transferred to capacitor $C_{20}$ so that the charge across $C_{20}$ is given by:

$$Q_{C20} = C_{20}V_{20} = C_{22}V_i.$$

Finally, the output voltage due to the sampling of one of the channels is given by:

$$V_o = V_{20} = V_i \frac{C_{22}}{C_{20}}$$

As before, the output is proportional to the ratio of capacitors $C_{22}$ and $C_{20}$. Since this ratio is easily tightly controlled, a uniform output for uniform input in any given channel is realized without the need for channel matching. This embodiment is useful for LCD applications where voltage levels are sensed, instead of charge or current sensing as used above.

Note that the integrator circuit in FIG. 7 will also contribute an offset voltage across capacitor $C_{20}$. As before, switches S20 are used to place an offset cancellation voltage on capacitor $C_{20}$ between sampling periods. The voltage across capacitor $C_{20}$ where there is a non zero offset voltage at the input of amplifier is given by:

$$V_o = \frac{Q(C_{20})}{C_{20}} = \frac{Q(C_{22}) + Q_{os}}{C_{20}} - V_{os}$$

The charge $Q_{os}$ on the capacitor $C_{20}$ due to the offset voltage supplied by amplifier 51 is:

$$Q_{os} = V_{os}C_{22}.$$

Substituting the offset charge into the $V_o$ equation gives:

$$V_o = \frac{V_iC_{22}}{C_{20}} + \frac{V_{os}C_{22}}{C_{20}} - V_{os};$$

so that the offset voltage is canceled when $C_{22}$ is equal to $C_{20}$. Although this requires matching among the capacitors in a single channel, no matching is required across channels, and again the capacitors $C_{20}$ and $C_{22}$ will be fabricated in close physical proximity, so that variations in their values should affect both capacitors and the overall output of the channel should be unaffected. If needed the output of the circuit in FIG. 7 may be followed by a sample and hold circuit as in FIG. 3, or by an ADC or other circuitry as required.

Possible system embodiments of the improved multiple channel sensor interface include facsimile machines, handheld electronic scanners, bar code readers, cameras, imagers, and other optical systems, and any type of multiple channel current or charge input interface.

A few preferred embodiments have been described in detail hereinabove. It is to be understood that the scope of the invention also comprehends embodiments different from those described, yet within the scope of the claims.

Internal and external connections can be ohmic, capacitive, direct or indirect, via intervening circuits or otherwise. Implementation is contemplated in discrete components or fully integrated circuits in silicon, gallium arsenide, or other electronic materials families, as well as in optical-based or other technology-based forms and embodiments.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A multiple channel sensor interface circuit comprising:
   a plurality of input integrator circuits each having an input coupled to one fo plurality of input signals, and each having an output;
   a switched capacitor multiplexer having a plurality of inputs each coupled to a respective output of one of said input integrator circuits, operable to receive input data from each of said input integrator circuits in parallel, further operable to store said input data on capacitive storage elements, and operable to provide each one of said input data signals at an output thereof for transmission in a sequential fashion in response to one or more control signals;
   an output integrator stage coupled to said switched capacitor multiplexer; and
   an output sample-hold circuit coupled to said output integrator stage.

2. The multiple channel sensor interface circuit of claim 1, wherein said input integrator circuits comprise an analog amplifier having a capacitive storage element connected in a feedback configuration.

3. The multiple channel sensor interface circuit of claim 1, wherein said switched capacitor multiplexer comprises a plurality of capacitive storage elements coupled in parallel and operable to receive input samples in parallel and transmit said input samples sequentially, respective to timing circuitry.

4. The switched capacitor multiplexer of claim 3 wherein each of said capacitive storage elements comprises a capacitor coupled to a pair of switches operable to enable the capacitor to receive sensor input from the respective input integrator circuit and further coupled to a pair of switches operable to enable said capacitive storage element to sequentially transmit and sensor input.

5. The multiple channel sensor interface circuit of claim 1 wherein said output integrator stage comprises an analog amplifier having a capacitive storage element in a feedback amplifier configuration.

6. The multiple channel sensor interface circuit of claim 1 and further comprising timing circuit coupled to said switched capacitor multiplexer for supplying said control signals.

7. The multiple channel sensor interface circuit of claim 6 wherein said timing circuitry further comprises logic circuitry operable to enable said switched capacitor multiplexer to receive sensor inputs concurrently and transmit said sensor inputs sequentially.

8. The multiple channel sensor interface circuit of claim 1 wherein said switched capacitor multiplexer further comprises two reference voltages operable for setting the output voltage level by charging the capacitive storage elements of said switched capacitor multiplexer relative to one of said reference voltages and discharging said capacitive storage elements relative to the second of said reference voltages.

9. A multiple channel sensor interface circuit; comprising:
   a plurality of input integrator circuits each having an input coupled to one of a plurality of input signals, and each having an output;
   a switched capacitor multiplexer having a plurality of inputs each coupled to a respective output of one of said input integrator circuits, operable to receive input data from each of said input integrator circuits in parallel, further operable to store said input data on capacitive storage elements, and operable to provide each one of said input data signals at an output thereof for transmission in a sequential fashion in response to one or more control signals;
   an output integrator stage coupled to said switched capacitor multiplexer; and
   an analog-to-digital converter circuit coupled to said output integrator stage.

10. An integrated circuit implementing a multiple channel sensor interface, comprising:
    a plurality of inputs;
    a plurality of input integrator circuits each coupled to one of said inputs;
    a switched capacitor multiplexer having a plurality of inputs each coupled to one of said input integrator circuits, having a plurality of capacitive storage elements each selectively coupled to one of said input integrator circuits by first switches, each selectively coupled to a reference voltage by second switches, operable for storing the data from each of said inputs by use of said first and second of switches operable for charging each of said capacitive storage elements with the respective data from the respective input integrator circuit, and having a single output operable for sequentially transmitting each of said stored data from said inputs by sequentially discharging each of said capacitive storage elements relative to said reference voltage through the use of said first and second switches associated with each of said capacitive storage elements in response to one or more control signals;
    an output integrator stage coupled to said switched capacitor multiplexer; and
    an output analog-to-digital converter stage coupled to said output integrator stage and further coupled to an output node.

11. The integrated circuit of claim 10, wherein each of said input integrator circuits comprise an analog amplifier having a capacitive storage element connected in a feedback configuration.

12. The integrated circuit of claim 10, wherein said plurality of capacitive storage elements are arranged in parallel and operable to receive the output of respective input integrator circuits in parallel and further operable to transmit said input samples sequentially, responsive to timing circuitry.

13. The integrated circuit of claim 10 wherein said output integrator stage comprises an analog amplifier having a capacitor storage element coupled in a feedback amplifier configuration.

14. The integrated circuit of claim 10 and further comprising timing circuitry coupled to said input integrator circuits, further coupled to said switched capacitor multiplexer, and further coupled to said output amplifier, for enabling the sampling of the inputs in parallel and the transmission of the sensed data in a predetermined sequence.

15. A method for implementing an improved multiple channel sensor interface circuit comprising the steps of:
    providing a plurality of input integrator circuits each having an input coupled to a respective sensor input terminal;
    coupling each of said input integrator circuits to a switched capacitor multiplexer having an input for each integrator circuit and a single output;
    storing each input onto a capacitive storage element responsive to a pair of switches;
    transmitting each of said stored inputs to an output responsive to a second pair of switches, said switches operated so that the output sequentially reflects the value of each of said inputs;
    coupling said switched capacitor multiplexer to an output integrator circuit;
    sampling input data into said input integrator circuits and into said switched capacitor multiplexer in a parallel fashion; and
    subsequently transmitting said sampled input data from the switched capacitor multiplexer into said output integrator and said output sample-hold circuit sequentially, so that the output node transmits values proportionally related to each input sample sequentially.

16. The method of claim 15, wherein the step of providing said input integrator circuits comprises providing a plurality of analog amplifiers each having a capacitive storage element connected in a feedback configuration.

17. The method of claim 15, wherein said step of coupling said input integrator circuits to a switched capacitor multiplexer comprises coupling said input integrator circuits to a switched capacitor multiplexer having two reference voltages, one for charging and another for discharging the switched capacitor multiplexer, and operable to set the output voltage level by charging the capacitors relative to the first of said reference voltages and discharging the capacitors relative to the second of said reference voltages so that the voltage at the output of the switched capacitor multiplexer is a desired voltage relative to the voltage at the input of the switched capacitor multiplexer.

* * * * *